US009369111B1

(12) United States Patent
McHugh et al.

(10) Patent No.: US 9,369,111 B1
(45) Date of Patent: Jun. 14, 2016

(54) FABRICATION OF SURFACE ACOUSTIC WAVE FILTERS HAVING PLATE MODES

(71) Applicant: Resonant Inc., Santa Barbara, CA (US)

(72) Inventors: Sean McHugh, Santa Barbara, CA (US); Neal Fenzi, Santa Barbara, CA (US); Mike Eddy, Santa Barbara, CA (US); Patrick Turner, San Bruno, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 14/925,603

(22) Filed: Oct. 28, 2015

(51) Int. Cl.

| | |
|---|---|
| ***H03H 9/64*** | (2006.01) |
| ***H03H 3/08*** | (2006.01) |
| ***H03H 3/04*** | (2006.01) |
| ***H03H 9/25*** | (2006.01) |
| ***H03H 9/02*** | (2006.01) |

(52) U.S. Cl.
CPC . *H03H 9/64* (2013.01); *H03H 3/04* (2013.01); *H03H 3/08* (2013.01); *H03H 9/02543* (2013.01); *H03H 9/02574* (2013.01); *H03H 9/25* (2013.01)

(58) Field of Classification Search
CPC . H03H 3/08; H03H 9/02535; H03H 9/02543; H03H 9/02574; H03H 9/02818; H03H 9/02866; H03H 9/058; H03H 9/64; H03H 9/6496; H03H 3/04; H03H 9/25; G06F 17/5045; H01L 41/04; H01L 41/042; H01L 41/08; H01L 41/0805; H01L 41/081
USPC .......... 333/193–196, 133; 716/104, 106, 110, 716/132
See application file for complete search history.

(56) References Cited

U.S. PATENT DOCUMENTS

| | | | | |
|---|---|---|---|---|
| 4,234,859 | A * | 11/1980 | Ikushima | H03H 9/02622 29/25.35 |
| 6,693,501 | B2 * | 2/2004 | Sawada | H03H 9/0071 333/133 |
| 7,474,033 | B2 * | 1/2009 | Oshio | H03H 3/10 310/313 A |
| 7,800,464 | B2 | 9/2010 | Tajima et al. | |
| 7,911,111 | B2 | 3/2011 | Suzuki et al. | |
| 8,035,464 | B1 * | 10/2011 | Abbott | H03H 9/02574 310/313 B |
| 8,115,365 | B2 | 2/2012 | Suzuki et al. | |
| 8,264,303 | B2 | 9/2012 | Suzuki | |
| 8,288,918 | B2 | 10/2012 | Suzuki et al. | |
| 8,585,847 | B2 | 11/2013 | Suzuki et al. | |
| 8,701,065 | B1 * | 4/2014 | Silver | H03H 9/465 333/133 |
| 8,990,742 | B2 * | 3/2015 | Turner | G06F 17/505 716/104 |
| 9,038,005 | B2 * | 5/2015 | Turner | G06F 17/505 716/104 |
| 9,165,101 | B2 * | 10/2015 | Turner | G06F 17/505 |
| 9,208,274 | B2 * | 12/2015 | Turner | G06F 17/505 |

* cited by examiner

*Primary Examiner* — Barbara Summons
(74) *Attorney, Agent, or Firm* — SoCal IP Law Group LLP; Steven C. Sereboff; John E. Gunther

(57) ABSTRACT

Methods of designing surface acoustic wave (SAW) filters and SAW filters fabricated on piezoelectric substrates are disclosed. A filter design including two or more SAW resonators may be established. Admittances of relevant plate modes associated with each of the two or more SAW resonators may be modeled and added in parallel with the admittances of the respective SAW resonators. The filter design including the admittances of relevant plate modes may be iterated to establish a final filter design that satisfies a set of design requirements.

19 Claims, 10 Drawing Sheets

©2015 Resonant Inc.

©2015 Resonant Inc.

©2015 Resonant Inc.

©2015 Resonant Inc.

©2015 Resonant Inc.

650

600

700

©2015 Resonant Inc.

©2015 Resonant Inc.

©2015 Resonant Inc.

©2015 Resonant Inc.

FABRICATION OF SURFACE ACOUSTIC WAVE FILTERS HAVING PLATE MODES

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to radio frequency filters using surface acoustic wave (SAW) resonators, and specifically to filters for use in communications equipment.

2. Description of the Related Art

As shown in FIG. 1, a SAW resonator 100 may be formed by thin film conductor patterns formed on a surface of a substrate 150 made of a piezoelectric material such as quartz, lithium niobate, lithium tantalate, or lanthanum gallium silicate. The substrate 150 may be a single-crystal slab of the piezoelectric material, or may be a composite substrate including a thin single-crystal wafer of the piezoelectric material bonded to another material such as silicon, sapphire, or quartz. A composite substrate may be used to provide a thermal expansion coefficient different from the thermal expansion coefficient of the single-crystal piezoelectric material alone. A first transducer 110 may include a plurality of parallel conductors. A radio frequency or microwave signal applied to the first transducer 110 via an input terminal IN may generate an acoustic wave on the surface of the substrate 150. As shown in FIG. 1, the surface acoustic wave will propagate in the left-right direction. A second transducer 120 may convert the acoustic wave back into a radio frequency or microwave signal at an output terminal OUT. The conductors of the second transducer 120 may be interleaved with the conductors of the first transducer 110 as shown. In other SAW resonator configurations (not shown), the conductors forming the second transducer may be disposed on the surface of the substrate 150 adjacent to, or separated from, the conductors forming the first transducer.

The electrical coupling between the first transducer 110 and the second transducer 120 is highly frequency-dependent. The electrical coupling between the first transducer 110 and the second transducer 120 typically exhibits both a resonance (where the admittance between the first and second transducers is very high) and an anti-resonance (where the admittance between the first and second transducers is very low). The frequencies of the resonance and the anti-resonance are determined primarily by the pitch and orientation of the interdigitated conductors, the choice of substrate material, and the crystallographic orientation of the substrate material. The strength of the coupling between the first transducer 110 and the second transducer 120 depends on the length L of the transducers. Grating reflectors 130, 135 may be disposed on the substrate to confine most of the energy of the acoustic waves to the area of the substrate occupied by the first and second transducers 110, 120.

SAW resonators are used in a variety of radio frequency filters including band reject filters, band pass filters, and duplexers. A duplexer is a radio frequency filter device that allows simultaneous transmission in a first frequency band and reception in a second frequency band (different from the first frequency band) using a common antenna. Duplexers are commonly found in radio communications equipment including cellular telephones.

The characteristics of SAW resonators are sensitive to the temperature of operation. A microwave filter constructed from such resonators may degrade intolerably as the operating temperature is changed unless efforts are made to mitigate the sensitivity to temperature variations. One source of temperature dependence is expansion or contraction of the piezoelectric wafer as the temperature changes. The amount a material changes dimension with respect to temperature is called the coefficient of thermal expansion (CTE). Bonding a thin piezoelectric wafer to a thicker support substrate with a lower CTE will constrain the expansion and contraction of piezoelectric wafer as the temperature changes.

FIG. 2 is a cross-sectional view of the exemplary SAW resonator 100, previously shown in FIG. 1. The electrodes forming the first transducer 110, the second transducer 120, and the grating reflectors 130, 135 are deposited on a front surface 256 of a wafer 252 of piezoelectric material that optionally may be bonded to a backing substrate 254. The wafer 252 and the backing substrate 254, when present, collectively form a composite substrate 150. The wafer 252 may be quartz, lithium niobate, lithium tantalate, lanthanum gallium silicate, or some other piezoelectric material. The backing substrate 254 may be, for example silicon, sapphire, quartz, or some other material. Typically, but not necessarily, the backing substrate 254 may be made from a material having a lower coefficient of thermal expansion than the wafer 252. The wafer 252 and the backing substrate 254 may be directly bonded using a combination of pressure and elevated temperature. Alternatively, the wafer 252 and the backing substrate 254 may be bonded using a layer of adhesive (not shown).

An issue that may occur in SAW resonators formed on thin piezoelectric wafers (e.g. piezoelectric wafers having a thickness less than about 50 acoustic wavelengths at the resonant frequency of the SAW resonator) is that the front surface 256 of the wafer 252 and the back surface 258 of the wafer 252 form a resonant cavity indicated by the arrow 250. Acoustic waves generated by the transducers 110, 120 may reflect from the back surface 258 and resonate at particular frequencies. The reflection at the back surface 258 results from a change in acoustic wave velocity at the interface between the back surface 258 and the adjacent material, which may be air, a backing substrate, or adhesive. Although the quality factor for this resonant cavity may be low, it nonetheless affects the electrical response of SAW resonator. These spurious cavity modes are commonly referred to as plate modes.

Throughout this description, elements appearing in figures are assigned three-digit reference designators, where the most significant digit is the figure number where the element is first shown and the two least significant digits are specific to the element. An element that is not described in conjunction with a figure may be presumed to have the same characteristics and function as a previously-described element having the same reference designator.

DETAILED DESCRIPTION

Description of Apparatus

Figure 3:
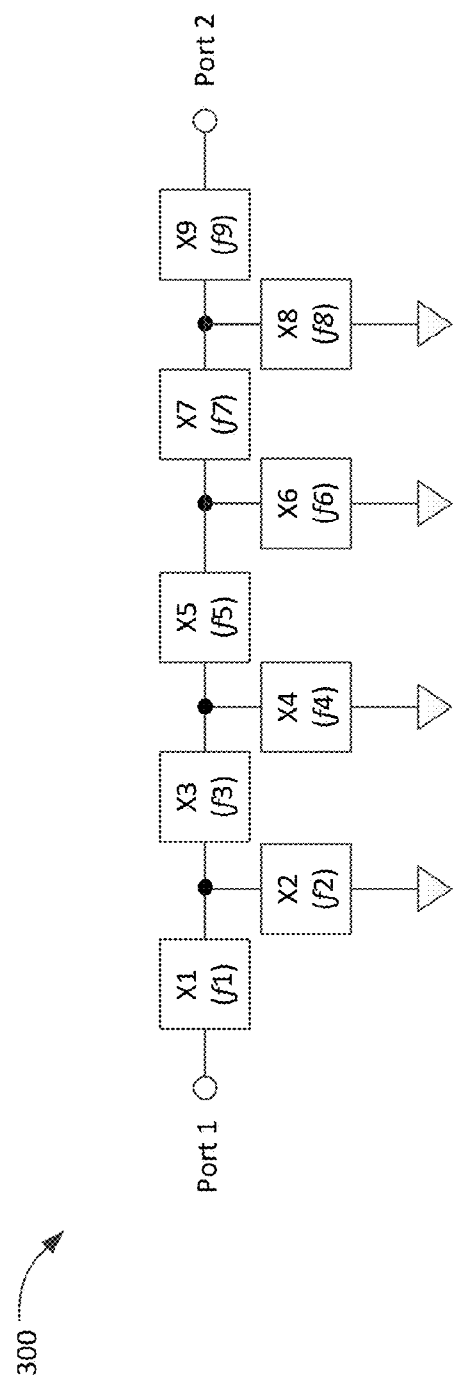
FIG. 3 is a block diagram of an exemplary SAW filter.

Filter circuits commonly incorporate more than one SAW resonator. For example, FIG. 3 shows a schematic diagram of an exemplary band-pass filter circuit 300 incorporating nine SAW resonators, labeled X1 through X9. The filter circuit 300 includes five series resonators (X1, X3, X5, X7, and X9) connected in series between an input (Port 1) and an output (Port 2). The filter circuit 300 includes four shunt resonators (X2, X4, X6, and X8) connected between junctions of adjacent series resonators and ground. The use of nine SAW resonators, five series resonators, and four shunt resonators is exemplary. A filter circuit may include more or fewer than nine SAW resonators and a different arrangement of series and shunt resonators. The filter circuit 300 may be, for example, a transmit filter or a receive filter for incorporation into a communications device.

Figure 1:
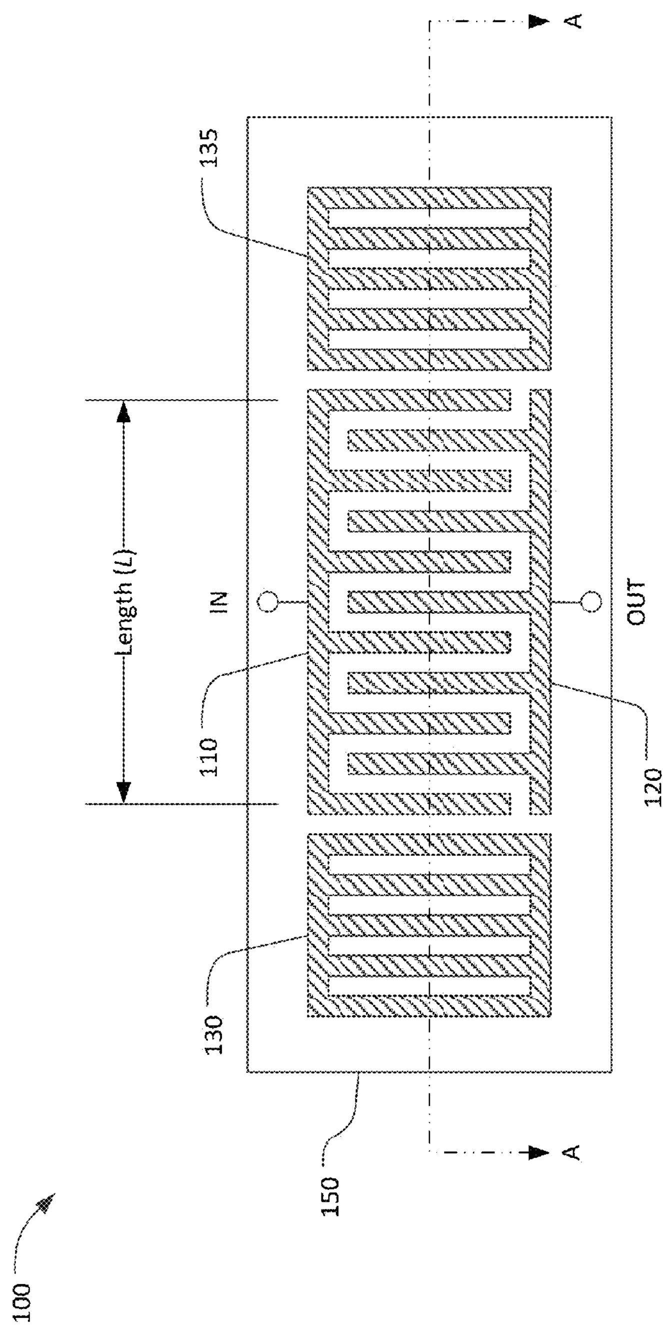
FIG. 1 is a schematic plan view of a SAW resonator.
Figure 2:
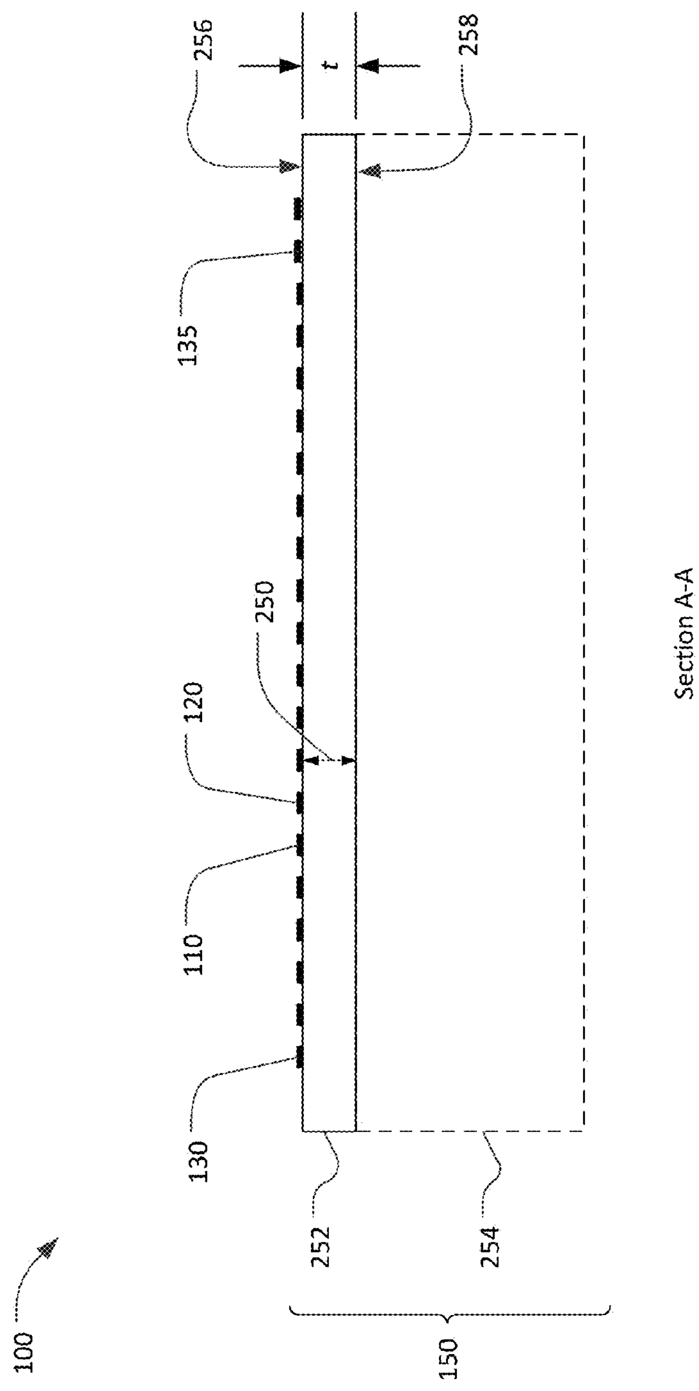
FIG. 2 is cross sectional view of a SAW resonator.

Each of the nine resonators X1-X9 may be comprised of inter-digital transducers and grating reflectors as shown in FIG. 1. Each of the nine resonators X1-X9 may have a corresponding resonant frequency, f1-f9. The resonant frequencies f1-f9 may all be different. The resonant frequencies of some of the resonators X1-X9 may be the same. Typically, the resonant frequencies f2, f4, f6, f8 of the shunt resonators may be offset from the resonant frequencies f1, f3, f5, f7, f9 of the series resonators. When the filter circuit 300 is fabricated on a thin piezoelectric wafer or a composite substrate, different acoustic plate modes may be associated with each of the nine SAW resonators X1-X9.

Figure 4:
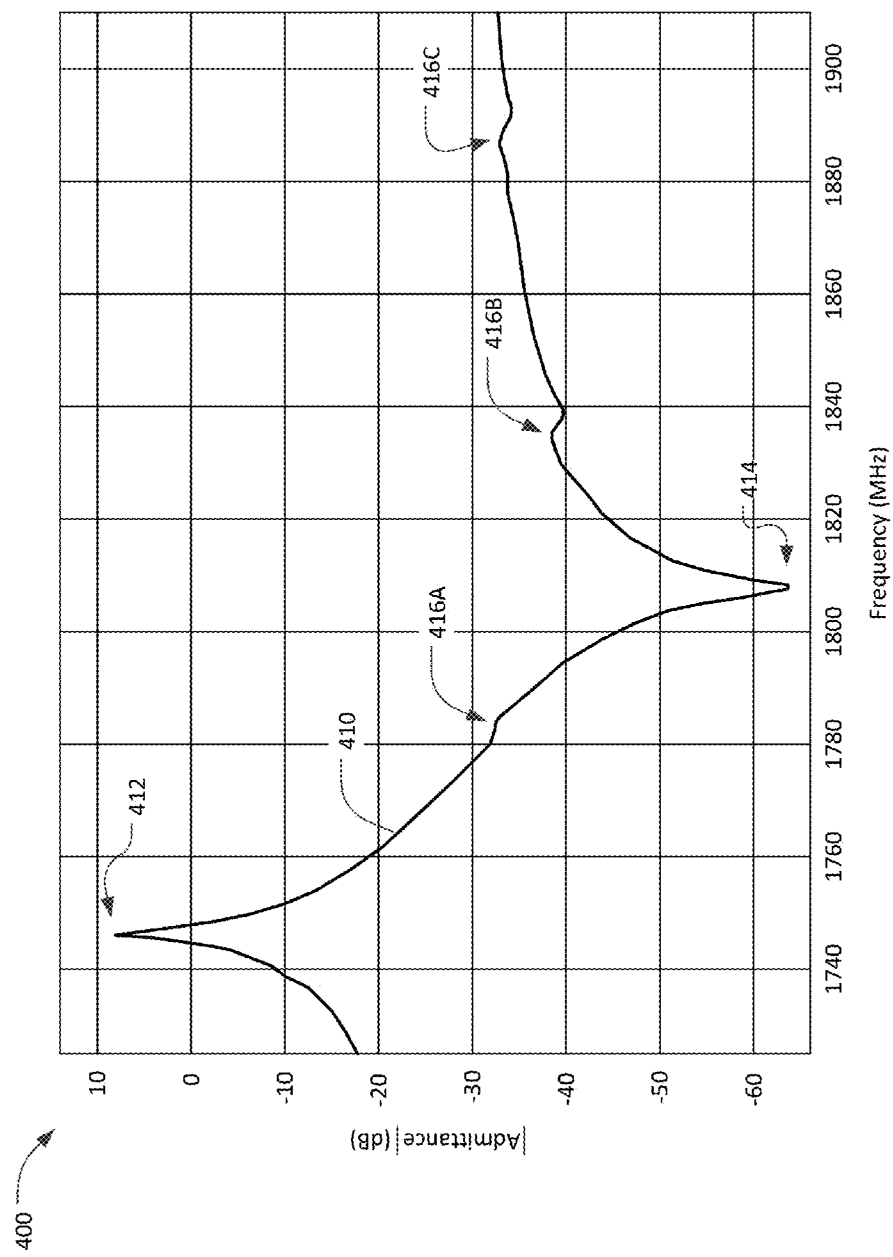
FIG. 4 is a graph of the admittance of a SAW resonator as a function of frequency.

FIG. 4 is a graph 400 plotting the magnitude of the admittance of a single SAW resonator, which could be any of the resonators X1-X9 in the filter circuit 300, fabricated on a thin piezoelectric wafer or a composite substrate. The line 410 is the admittance, which exhibits a resonance 412, where the admittance is maximum, and an anti-resonance 414, where the admittance is minimum. The line 410 also exhibits ripples at 416A, 416B, and 416C due to plate modes.

Figure 5:
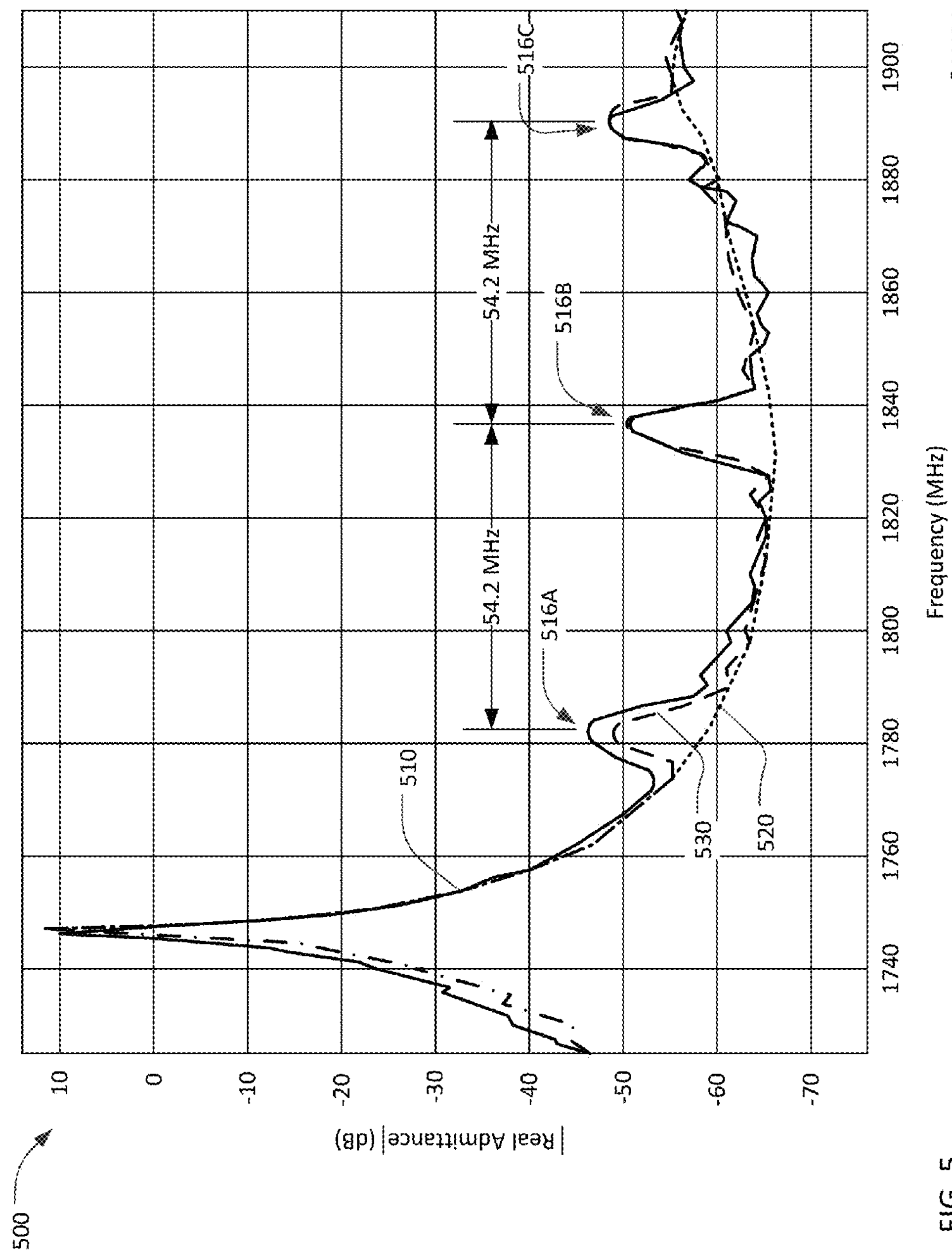
FIG. 5 is a graph of the real portion of the admittance of a SAW resonator as a function of frequency.

The effect of the plate modes on resonator performance is more visible in a plot of the real part of the admittance of the SAW resonator, as shown in FIG. 5. The solid line 510 represents the measured real portion of the admittance of the resonator. The contribution of the plate modes can be seen at 516A, 516B, and 516C. The dotted line 520 represents the expected performance of the resonator from a model that does not consider plate modes. The dashed line 530 represents the expected performance of the resonator from a model, to be discussed subsequently, that accounts for the plate modes.

The plate modes at 516A, 516B, and 516C are specifically associated with this resonator. Another resonator fabricated adjacent to this SAW resonator on the same substrate may be associated with a different set of plate modes.

The plate modes at 516A, 516B, and 516C are different order modes of the same resonant cavity. The frequencies can be determined using the simple Fabry-Perot formula:

$$f_n = nc/2t, \tag{1}$$

where t is the piezoelectric wafer thickness, c is the effective speed of sound for the plate modes, and n=1, 2, . . . is the mode index. As shown in FIG. 5, the high-order (n) plate modes 516A, 516B, 516C are evenly spaced at frequency intervals of 54.2 mHz. From equation (1), the frequency interval Δf between adjacent plate modes is given by $$\Delta f = c/2t. \tag{2}$$

Note that c is not necessarily the speed of sound for bulk or surface waves. Instead, it is a parameter with dimensions meters/second that is determined from measurement on single SAW resonators. To determine the value of c for a SAW resonator, the frequency interval Δf between adjacent plate modes may be determined from measurements of the resonator performance. A preliminary value $c_0$ can then be estimated as $$c_0 = 2t\Delta f. \tag{3}$$

The mode number n of each plate mode may be determined by $$n = \text{round}(2tf_n/c_0), \tag{4}$$

where $f_n$ is the resonant frequency of the plate mode. It is expected that the mode numbers of the plate modes of a SAW resonator will be consecutive integers. The value of c can then be determined as $$c = 2tf_n/n. \tag{5}$$

The inventors have found that the value of c for a given SAW resonator is different from the value of c for a similar SAW resonator having a different resonant frequency. The relationship between c and resonator frequency may be determined from measurements performed on SAW resonators with various resonant frequencies. The inventors have found that the dependence of c on resonator frequency may be modeled using a simple linear equation $$c(f_{res}) = af_{res} + b, \tag{6}$$

where $f_{res}$ is resonator frequency and a and b are constants determined from experimental data.

Specifications on SAW filters commonly specify the filter performance over one or more pass bands and one or more stop bands. The total frequency range covered by the start and stop bands may be considered a frequency span of the filter. Plate modes having resonant frequencies within or immediately adjacent to the frequency span may affect filter performance and are thus considered relevant plate modes, while plate modes having resonant frequencies remote from the frequency span are irrelevant to filter performance. The effect of plate modes on filter performance can be modeled, for example, by adding the admittance of each relevant plate mode in parallel with the admittance of the respective resonator.

Figure 6B:
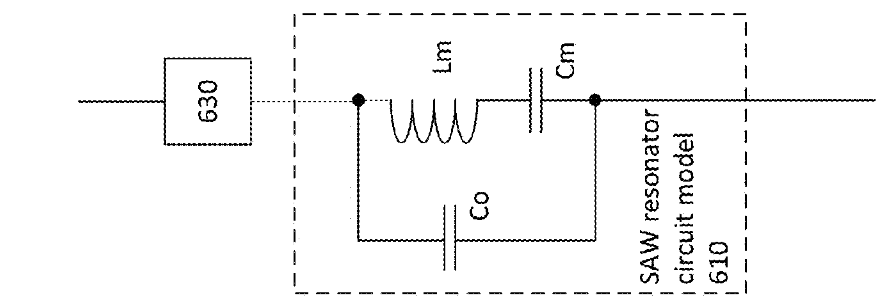
FIG. 6B is a schematic diagram of another circuit model of a SAW resonator including plate modes.
Figure 6A:
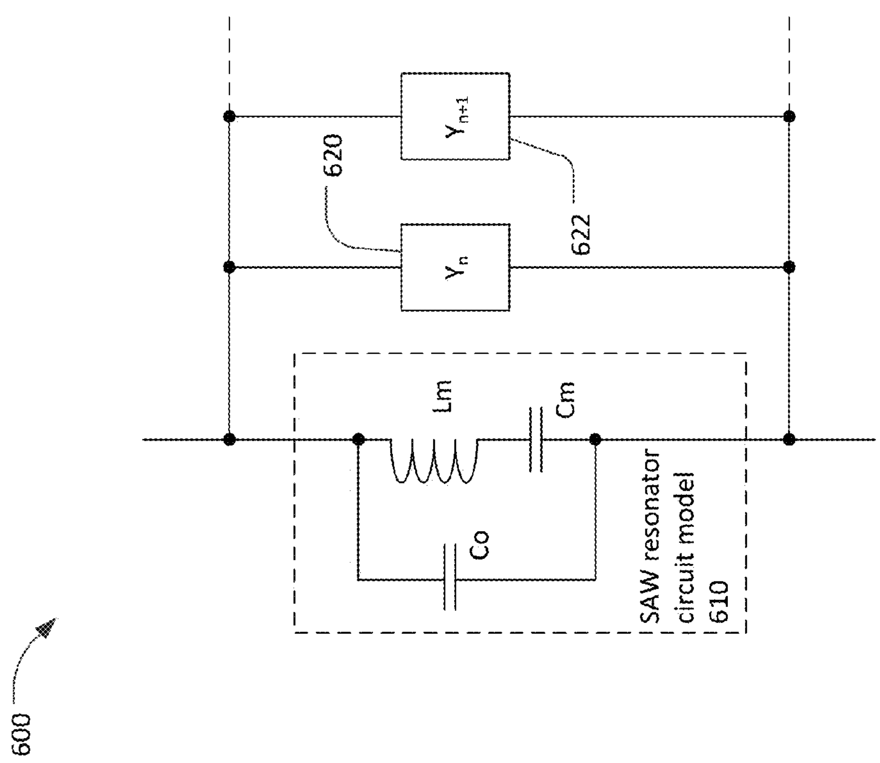
FIG. 6A is a schematic diagram of a circuit model of a SAW resonator including plate modes.

SAW filter design may be performed, at least in part, using a circuit design tool. When using a circuit design tool, each SAW resonator may be represented by a lumped-element equivalent circuit. FIG. 6A shows a schematic diagram of an enhanced equivalent circuit model 600 of a SAW resonator with associated plate modes. The enhanced equivalent circuit model 600 includes a SAW resonator circuit model 610 in parallel with admittances $Y_n$, $Y_{n+1}$, . . . (620, 622) of one or more relevant plate modes associated with the SAW resonator. The SAW resonator circuit model 610, consisting of inductor Lm and capacitors Co and Cm, shown in FIG. 6 is simplistic. A more complex SAW resonator circuit model, including additional lumped components, may be used during SAW filter design. An alternative enhanced equivalent circuit model, shown in FIG. 6B, could be formed by the SAW resonator circuit model 610 in series with a model 630 of one or more relevant plate modes associated with the SAW resonator.

The admittance 620, 622 of each plate mode is given by the formula $$Y_n = Y_{n,re} + Y_{n,im}, \quad (7)$$

where $Y_{n,re}$ and $Y_{n,im}$ are the real and imaginary parts, respectively, of the admittance. The real part of the admittance $Y_{n,re}$ of Y of a plate resonator is given by[1]

$$Y_{n,re} = g_0 * \sin^2 z/z^2, \quad (8)$$

And the imaginary part of the admittance $Y_{n,im}$ is given by $$Y_{n,im} = g_0 * (\sin 2z - 2z)/z^2, \quad (9)$$

where $z = g_1 * (f - f_n)/f_n$, f is the frequency, $f_n$ is the resonant frequency of the plate mode, and $g_0$ and $g_1$ are parameters determined by fitting equations (7) and (8) to the measured admittance of single SAW resonators. The inventors have found that parameters $g_0$ and $g_1$ vary with respect to the length L (see FIG. 1) of the SAW resonator and the thickness t of the piezoelectric wafer. In particular, $$g_0 = k_0 L/t, \quad (10)$$

$$g_1 = k_1 L, \quad (11)$$

where $k_0$ and $k_1$ are constants determined by fitting equations (8) and (9) to the measured admittance of a plurality of SAW resonators having different lengths and piezoelectric wafer thicknesses.

[1] Morgan, D., *Surface Acoustic Wave Filters*, Academic Press, 2007

With the values a, b, $k_0$, and $k_1$ determined from measurements on multiple SAW resonators with different resonant frequencies, equations (8) to (11) may be used to calculate complex admittances of plate modes associated with SAW resonators having various resonant frequencies, lengths, and piezoelectric wafer thicknesses. The admittances of the plate modes may be added to the admittance calculated for the SAW resonators. The dashed curve 530 in FIG. 5 is the calculated real admittance of an exemplary resonator including the admittances of plate modes calculated using equation (8).

Figure 7:
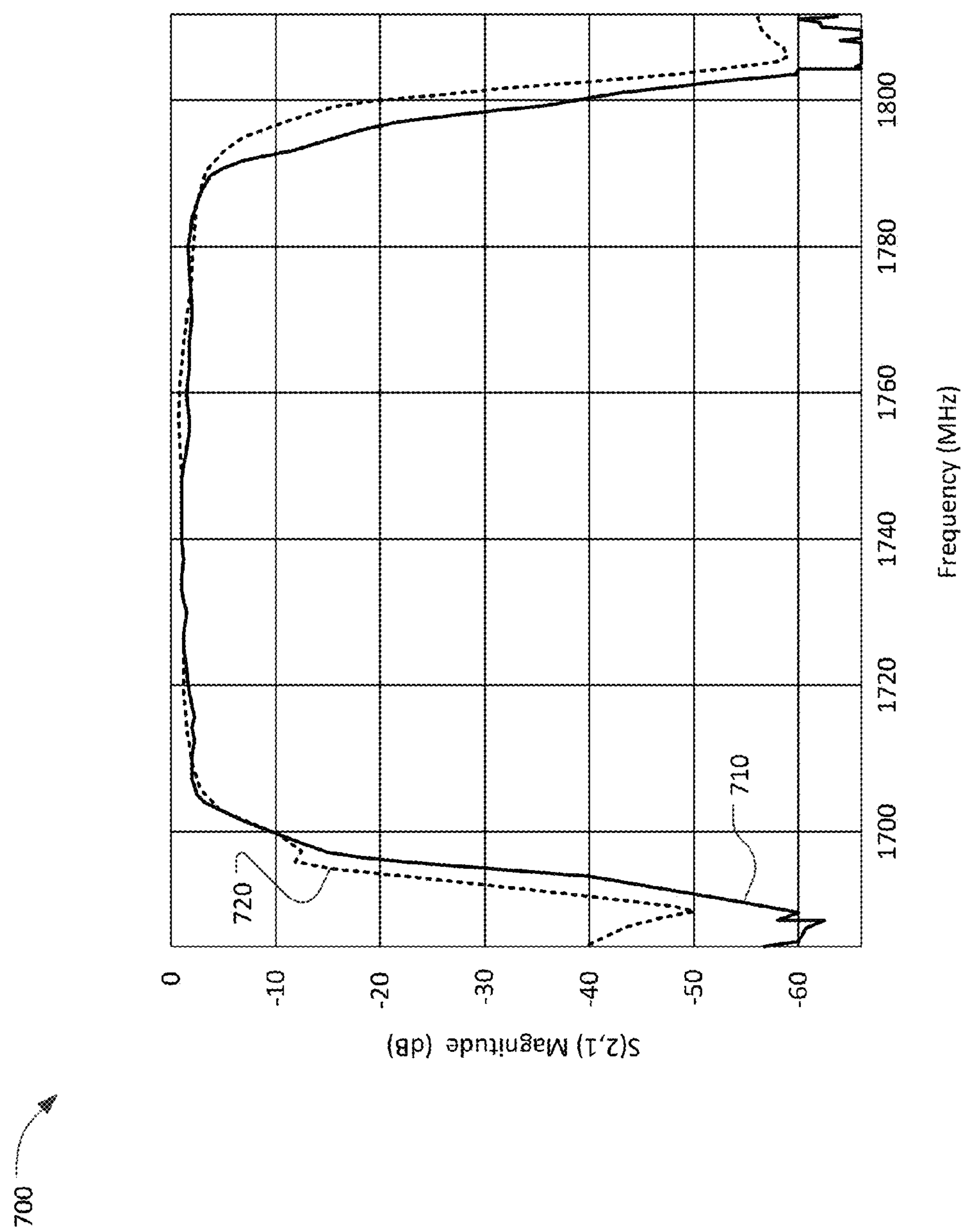
FIG. 7 is a graph of the S(1,2) parameter of a SAW filter as a function of frequency.

The performance of a multi-resonator band-pass filter can now be calculated more accurately by incorporating the plate mode admittances of each SAW resonator. FIG. 7 is a plot of the S(2,1) parameter of the exemplary filter 300 fabricated on a composite substrate. A schematic diagram of this filter, which incorporates nine SAW resonators, was previously shown in FIG. 3. S-parameters are a convention used to describe the performance of linear electrical networks. The solid line 710 is a plot of S(2,1), which is the transfer function from port 1 to port 2 of an electrical network. S(2,1) is essentially the “insertion loss” of the filter 300 with a change in numeric sign (e.g. S(2,1)=−3 dB is equivalent to an insertion loss of 3 dB). In this case, the solid line 710 plots the measured input-to-output transfer function of the filter 300 (which includes plates modes). The dotted line 720 plots the expected input-to-output transfer function of the filter 300 based on a model that does not consider plate modes.

A band-pass filter may be required to transfer a signal input at Port 1 of the filter 300 to Port 2 with little loss for frequencies within a predetermined “pass band” commonly defined as the frequency band where S(2,1) is greater than −3 dB. Frequencies outside of the pass band are substantially attenuated. The specifications on a band pass filter may include a minimum value of S(2,1) (i.e. a maximum insertion loss) over the pass band and a maximum value of S(2,1) (i.e. a minimum insertion loss) for each of one or more stop bands outside of the pass band.

Figure 8:
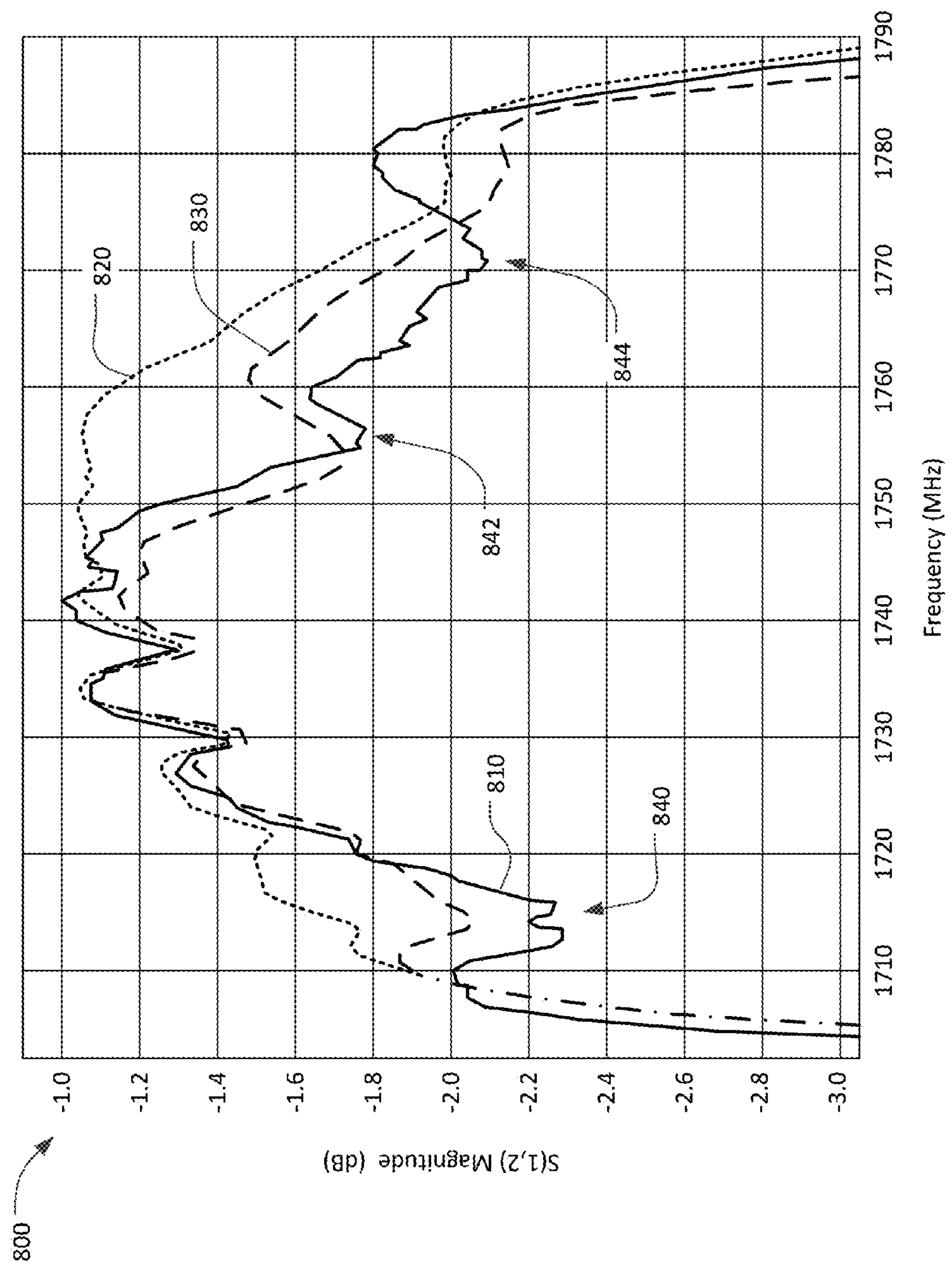
FIG. 8 is another graph of the S(1,2) parameter of a SAW filter as a function of frequency.

The effect of the plates modes on the performance of the filter 300 can be seen in FIG. 8, which shows the magnitude of S(2,1) on an expanded scale compare with FIG. 7. The solid line 810 is the measured performance. The dotted line 820 shows the anticipated performance of the filter 300, calculated using a model that does not consider plate modes. The measured performance (solid line 810) exhibits several ripples or dips (indicated by arrows 840, 842, 844) which are not found in the anticipated performance (dotted line 820). The dashed line 830 shows the filter performance predicted by a model that includes the admittances of plate modes, calculated using equations (8) and (9). While imperfect, the model including plate modes provides a significantly more accurate prediction of the measured filter performance.

As indicated in equation (1), the frequencies of the plate modes are highly dependent on the thickness t of the piezoelectric wafer. As can be visualized from FIG. 8, variations in plate modes frequencies may cause unacceptable variations in filter performance. Taking the derivative of equation 1 with respect to thickness gives $$df_n/dt = -nc/2t^2. \quad (12)$$

For typical thickness of the piezoelectric wafer, $f_n$ (the frequency of the nth plate mode) may vary by over 100 MHz for a 1 micron variation in piezoelectric wafer thickness. In filter applications with demanding performance requirements, variations in piezoelectric wafer thickness may have to be controlled to 100 nm or less to avoid substantial manufacturing yield loss due to variations in the plate mode frequencies which corrupt the passband.

Referring back to FIG. 5, a SAW resonator fabricated on a thin piezoelectric wafer or on a composite substrate having a particular piezoelectric wafer thickness may exhibit plate mode resonances at 1782 MHz (arrow 516A), 1836 MHz (arrow 516B), and 1890 MHz (arrow 516C). If the thickness of the piezoelectric wafer was slowly increased, the plate mode resonant frequencies would shift lower in frequency. When the piezoelectric wafer thickness had been increased by an amount that causes the plate mode resonant frequencies to shift by 54.2 MHz, the plate mode resonance indicated by the arrow 516B would have shifted from its original frequency at 1836 MHz to a new frequency of 1782 MHz (i.e. to the original position of the resonance indicated by the arrow 516A, which would have shifted to the left outside of the range of the graph 500. At this point, the plot of the real admittance would look very similar to the solid line 510.

The plate mode resonances of every SAW resonator in a filter would be similarly affected, with the net result that the performance of the filter with the plate mode resonances shifted by about 54.2 MHz would be equivalent or very similar to the performance of the original filter.

Figure 9:
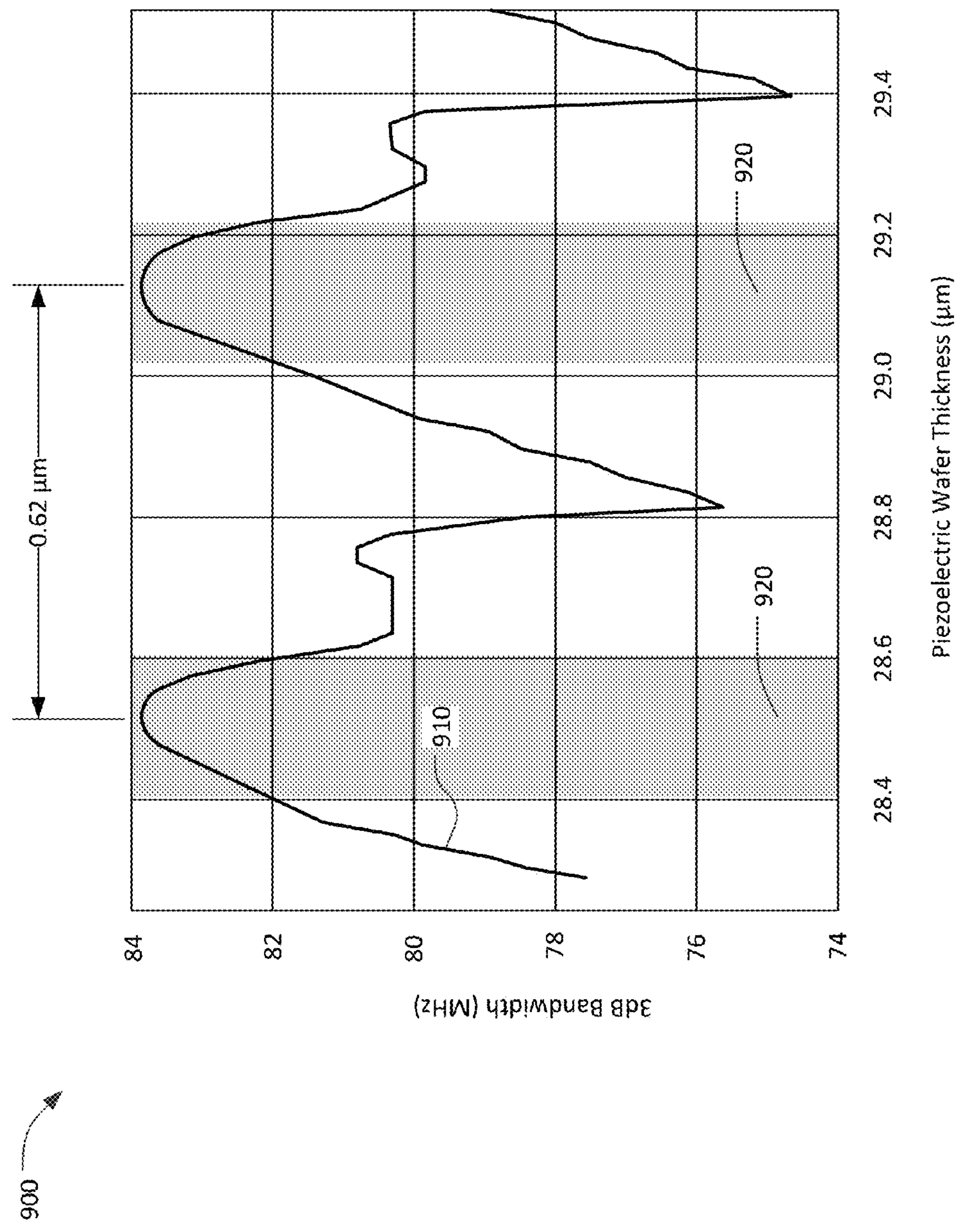
FIG. 9 is a graph illustrating a variation in filter performance with piezoelectric wafer thickness.

Combining equations (2) and (12) gives $$\Delta t = c/(2f_n), \quad (13)$$

where Δt is the thickness difference between two piezoelectric wafers that result in filters having equivalent performance. The performance of two filters is considered to be “equivalent” if both filters meet the same set of performance requirements. For example, FIG. 9 is a graph 900 of the bandwidth of a simulated filter as a function of piezoelectric wafer thickness. The solid line 910 represents the filter bandwidth, which varies cyclically with wafer thickness with a period of about 0.62 μm. Assuming the specified bandwidth of the filter is 83±1 MHz, equivalent filters can be constructed on hybrid substrates where the piezoelectric wafer thickness is 28.5±0.1 μm or 29.12±0.1 μm (represented by the shaded areas 920 in FIG. 9) or other thickness ranges thicker or thinner than these thickness ranges by integer multiples of 0.62 μm (e.g. 27.88±0.1 μm, 29.74±0.1 μm). Filters made on piezo electric wafers outside of these thickness ranges (represented by unshaded areas in FIG. 9) will not provide the specified bandwidth. The ability to use different thicknesses for the piezoelectric wafer may provide significant improvement to the yield of piezoelectric wafers or composite substrates during manufacturing.

Figure 10:
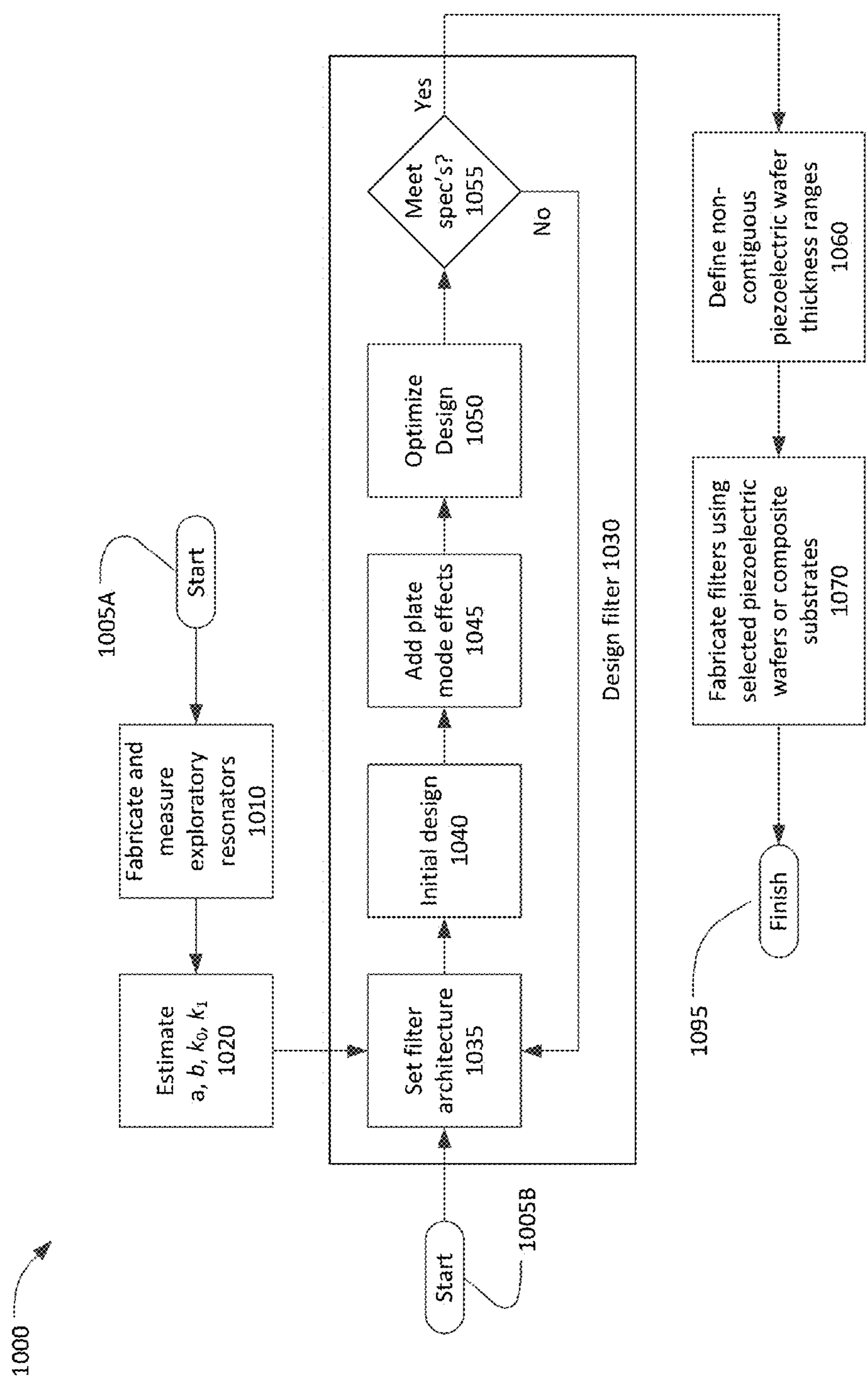
FIG. 10 is flow chart of a method for designing and fabricating a SAW filter.

A group of two or more noncontiguous thickness ranges, t±∈, t±∈±Δt, t±∈±2Δt, . . . can be defined for the piezoelectric wafer, where ±c is a tolerance range and Δt may be defined by equation (13) or determined from experimental data. Piezoelectric wafers, either alone or as components of composite substrates, with thicknesses falling within any range of the two or more noncontiguous thickness ranges may be used to fabricate filters with equivalent performance, which is to say filters meeting the same set of performance requirements. Piezoelectric wafers, either alone or as components of composite substrates, with thicknesses outside of the two or more noncontiguous thickness ranges may not be used to fabricate filters meeting the set of performance requirements Description of Processes FIG. 10 is a flow chart of a process 1000 for designing and fabricating a SAW filter. The process 1000 starts at either 1005A or 1005B with a set of specifications for the filter. The process 1000 ends at 1095 after manufacturing of filters meeting the specification has been completed.

The set of specifications determined prior to the start of the process 1000 may include, for example, specifications on the lower and upper frequencies of a pass band and, optionally, one or more stop bands. The set of specifications may include a minimum value of S(2,1) (i.e. a maximum insertion loss) over the pass band and maximum values of S(2,1) (i.e. minimum insertion losses) over each stop band, if defined. The set of specifications may include an input impedance range. The input impedance range may be defined, for example, as a maximum reflection coefficient or a maximum voltage standing wave ratio (VSWR) at the input of the filter when driven by a source with a predetermined source impedance. The input impedance range may be defined in some other manner. The set of specifications for the filter may include other requirements such as a maximum die size, an operating temperature range, an input power level, and other requirements.

The first time the process 1000 is used to design a filter, the process may start at 1005A. At 1010, one or more exploratory SAW resonators may be fabricated using composite substrates representative of the substrates to be used for production of the filter to be designed. The exploratory SAW resonators are use to explore or discover the parameters of plate modes associated with each SAW resonator. Specifically, the substrates used to fabricate the exploratory SAW resonators may include a base substrate and a piezoelectric wafer made of the same material and crystalline orientation (i.e. the angle of the surface of a substrate to the internal crystalline axis) intended for use in production. Exploratory SAW resonators with several different resonance frequencies may be made using the same processes (i.e. metal material and thickness, line and space ratio, dielectric overcoat, etc.) intended for use in production. The admittance and other characteristics of the exploratory SAW resonators may then be measured.

At 1020, the parameters a, b, $k_0$, and $k_1$ may be determined from the measurements of the exploratory SAW resonators. The frequencies of the plate modes may be determined for each sample resonator and the effective speed of sound c may be determined for each sample resonator using equations (3) thru (5). The dependence of c on resonator frequency may be determined and the parameters a and b may be determined by fitting equation (6) to the experimental data. The parameters $g_0$ and $g_1$ may be determined by fitting equations (7) and (8) to measurements of the real and imaginary admittance of the exploratory SAW resonators. Parameters $k_0$ and $k_1$ may then be determined from equations (11) and (12). Subsequent filter designs may start at 1005B, since the parameters a, b, $k_0$, and $k_1$ determined at 1010 and 1020 may be reused.

At 1030, the filter may be designed using a design method that accounts for the effects of the plate modes. The actions from 1035 to 1055 constitute an exemplary set of steps that may be taken to design the filter. Other design methods may be used at 1030. The design method used at 1030 may include different steps, more or fewer steps and/or the same steps performed in different order.

First, at 1035, a filter architecture including the number, type, and arrangement of SAW resonators may be selected. For example, the band-pass filter of FIG. 3 has five series resonators and four shunt resonators. Other filter architectures may include more or fewer series and/or shunt SAW resonators, the same number of SAW resonators connected differently (for example having a shunt resonator connected from the input and/or output port to ground).

Next, at 1040, an initial filter design using the selected architecture may be established. The initial filter design may be performed, for example, by a design engineer using a circuit design software tool and/or an electromagnetic (EM) analysis tool. When a circuit design tool is used, the filter may be analyzed as an electronic circuit, with the SAW resonators represented by combinations of lumped capacitor, inductor, and resistor elements. When an EM analysis tool is used, the filter may be represented by models of the SAW resonator transducers on the substrate. Either or both of circuit design tool and the EM analysis tool may be capable of automated optimization of the filter design to satisfy, to the extent possible, the filter specifications.

Once an initial design is established at 1040, the effect of plate modes may be determined at 1045. For example, the admittances of plate modes, calculated using equations (8) and (9), may be added in parallel with the admittances of the SAW resonators and the effect of the plate modes on the filter performance may be determined using either the circuit design software tool and/or the electromagnetic (EM) analysis tool. Alternatively, a model of relevant plates modes may be added in series with a model of the SAW resonators and the effect of the plate modes on the filter performance may be determined using either the circuit design software tool and/or the electromagnetic (EM) analysis tool.

The design, including the effects of the plate modes, may be optimized at 1050. The optimization may be performed using an automated design tool which may be the same or different from the design tool used at 1040 to establish the preliminary design. For example, the preliminary design may be performed using a circuit design tool and the optimization at 1050 may be performed using an EM analysis tool.

Note that the architecture first selected at 1035 may not necessarily be capable of satisfying the filter specifications. For example, if the specifications for a band-pass filter include a narrow pass band and high stop-band rejection, the specifications may not be satisfied with an architecture having only a few SAW resonators. At 1055, a determination may be made whether or not the optimized design from 1050 meets the specifications established before the start of the process 1000. If the selected filter architecture proves incapable of satisfying the filter specifications ("no" at 1055), the design method 1030 may be repeated from 1035 one or more times using increasingly complex filter architectures (i.e. filter architectures with more SAW resonators) until the optimized filter meets the design requirements.

When a filter design meeting the requirements has been established ("yes" at 1055), further analysis may be performed at 1060 to define a set of noncontiguous thickness ranges for the piezoelectric wafer that can be used to fabricate (using the same design and processes) filters having equivalent performance, which is to say filters that meet the specifications. This analysis may include analyzing how one or more filter performance parameters vary with piezoelectric wafer thickness (see FIG. 8 for example) and determining a noncontiguous set of piezoelectric wafer thickness ranges that allow fabrication of filters that meet the specification.

At 1070, filters according to the design from 1030 may be fabricated on selected piezoelectric wafers (which may be components of composite substrates) having piezoelectric wafer thickness within one of the set of piezoelectric wafer thickness ranges defined at 1060. Having two or more useable piezoelectric wafer thickness ranges (as opposed to a single narrow thickness range) may significantly improve the yield of piezoelectric wafers and/or composite substrates during manufacturing. For example, one process for preparing composite substrates is to bond a relative thick piezoelectric wafer to a backing substrate and then polishing the piezoelectric wafer to its desired thick after bonding. Currently, a composite substrate where the piezoelectric wafer was over-polished (i.e. polished until it was too thin) may be discarded. When a set of piezoelectric thickness ranges is available, such a composite substrate may be salvaged by polishing the piezoelectric wafer down to a thinner thickness range.

While a band pass filter has been used as an example in this description, plate modes can affect the performance of other types of filters. The same analysis methods may be used to design other types of SAW filters such as low pass, high pass and band reject filters and duplexers.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method of designing a surface acoustic wave (SAW) filter to be fabricated on a piezoelectric wafer, the method comprising:

establishing a filter design including two or more SAW resonators;

adding admittances of relevant plate modes associated with each of the two or more SAW resonators;

iterating the filter design including the admittances of relevant plate modes to establish a final filter design that satisfies a set of design requirements.

2. The method of claim 1, wherein adding admittances of relevant plate modes comprises adding the admittances of the respective relevant plate modes in parallel with admittances of the two or more SAW resonators.

3. The method of claim 2, wherein the real and imaginary components, $Y_{re}$ and $Y_{im}$ respectively, of the admittance of each plate mode are given by the equations:

$$Y_{re}=g_0*\sin^2 z/z^2, \text{ and}$$

$$Y_{im}=g_0*(\sin 2z-2z)/z^2,$$

where $z=g_1(f-f_n)/f_n$, f is frequency, $f_n$ is the resonant frequency of the plate mode, and $g_0$ and $g_1$ are parameters, the method further comprising:

determining $g_0$ and $g_1$ by fitting the equations for $Y_{re}$ and $Y_{im}$ to measured admittance data for one or more exploratory SAW resonators.

4. The method of claim 3, wherein the resonant frequencies of plate modes associated with a particular SAW resonator of the two or more SAW resonators are given by the equation:

$$f_n=nc/2t,$$

where $f_n$ is the resonant frequency of a plate mode with a mode index n, where n is a positive integer; t is a thickness of the piezoelectric wafer; and c is an effective speed of sound for plate modes associated with the particular SAW resonator.

5. The method of claim 4, wherein the effective speed of sound for plate modes associated with the particular SAW resonator is given by the equation:

$$c=af_{res}+b,$$

where $f_{res}$ is a resonant frequency of the particular SAW resonator and a and b are constants, the method further comprising:

determining a and b by fitting the equation for $f_n$ to measured plate mode resonant frequencies for two or more exploratory SAW resonators having different resonant frequencies.

6. The method of claim 1, further comprising:

defining two or more noncontiguous thickness ranges for the piezoelectric wafer that can be used to produce filters according to the final filter design that satisfy the set of design requirements.

7. The method of claim 6, further comprising:

selecting a piezoelectric wafer having a thickness within one of the two or more noncontiguous thickness ranges; and fabricating a filter according to the final filter design on the selected piezoelectric wafer.

8. The method of claim 6, further comprising:

selecting a composite substrate including a piezoelectric wafer having a thickness within one of the two or more noncontiguous thickness ranges; and fabricating a filter according to the final filter design on the selected composite substrate.

9. A method of designing a surface acoustic wave (SAW) filter incorporating two or more surface acoustic wave (SAW) resonators to be fabricated on a piezoelectric wafer, the method comprising:

defining a respective enhanced equivalent circuit model of each of the two or more SAW resonators, each enhanced equivalent circuit model comprising:

a SAW resonator circuit model, and respective admittances of one or more relevant plate modes in parallel with the SAW resonator circuit model; and using the enhanced equivalent circuit models of the two or more SAW resonators to develop a filter design that satisfies a set of design requirements.

10. The method of claim 9, further comprising:

fabricating one or more exploratory SAW resonators;

measuring a respective admittance as a function of frequency for each of the one or more exploratory SAW resonators; and for each enhanced equivalent circuit model, calculating real and imaginary components of the admittance of each relevant plate mode using the equations:

$$Y_{re}=g_0*\sin^2 z/z^2, \text{ and}$$

$$Y_{im}=g_0*(\sin 2z-2z)/z^2,$$

wherein $z=g_1*(f-f_n)/f_n$, f is frequency, $f_n$ is the resonant frequency of the plate mode, and $g_0$ and $g_1$ are parameters determined by fitting the equations for $Y_{re}$ and $Y_{im}$ to the measured admittances of the one or more exploratory SAW resonators.

11. The method of claim 10, wherein the resonant frequencies of the one or more relevant plate modes are given by the equation:

$$f_n=nc/2t,$$

wherein $f_n$ is the resonant frequency of a plate mode with a mode index n, where n is a positive integer; t is a thickness of the piezoelectric wafer; and c is an effective speed of sound for plate modes associated with the SAW resonator.

12. The method of claim 11, wherein the one or more exploratory SAW resonators includes two or more exploratory SAW resonators having different frequencies, and for each of the two or more SAW resonators, the effective speed of sound for each relevant plate mode is given by the equation:

$$c=af_{res}+b,$$

where $f_{res}$ is a resonant frequency of the SAW resonator and a and b are constants determined by fitting the equation for c to data measured on the two or more exploratory SAW resonators having different resonant frequencies.

13. The method of claim 9, further comprising:

defining two or more noncontiguous thickness ranges for the piezoelectric wafer that can be used to produce filters according to the final filter design that satisfy the set of design requirements.

14. The method of claim 13, further comprising:

selecting a composite substrate including a piezoelectric wafer having a thickness within one of the two or more noncontiguous thickness ranges; and fabricating a filter according to the final filter design on the selected composite substrate.

15. The method of claim 13, further comprising:

selecting a piezoelectric wafer having a thickness within one of the two or more noncontiguous thickness ranges; and fabricating a filter according to the final filter design on the selected piezoelectric.

16. A method of producing a surface acoustic wave filter on a piezoelectric wafer, the method comprising:

determining two or more noncontiguous thickness ranges that define piezoelectric wafers upon which filters meeting a predetermined requirement can be fabricated according to a predetermined filter design using a predetermined fabrication process;

selecting a piezoelectric wafer with a thickness within one of the noncontiguous thickness ranges; and fabricating a filter on the selected piezoelectric wafer according to the predetermined filter design using the predetermined fabrication process, wherein thickness values not within any of the two or more noncontiguous thickness ranges define piezoelectric wafers upon which filters fabricated according to the predetermined filter circuit design using the predetermined fabrication process do not meet the predetermined requirement.

17. The method of claim 16, wherein the piezoelectric wafer is a portion of a composite substrate including a backing substrate bonded to the piezoelectric wafer.

18. A filter produced by the process of:

determining two or more noncontiguous thickness ranges that define piezoelectric wafers upon which filters meeting a predetermined requirement can be fabricated according to a predetermined filter design using a predetermined fabrication process;

selecting a piezoelectric wafer with a thickness within one of the noncontiguous thickness ranges; and fabricating a filter on the selected piezoelectric wafer according to the predetermined filter design using the predetermined fabrication process, wherein thickness values not within any of the two or more noncontiguous thickness ranges define piezoelectric wafer upon which filters fabricated according to the predetermined filter circuit design using the predetermined fabrication process do not meet the predetermined requirement.

19. The filter of claim 18, wherein the piezoelectric wafer is a portion of a composite substrate including a backing substrate bonded to the piezoelectric wafer.

* * * * *